(12) United States Patent
Zhai et al.

(10) Patent No.: US 9,633,974 B2
(45) Date of Patent: Apr. 25, 2017

(54) SYSTEM IN PACKAGE FAN OUT STACKING ARCHITECTURE AND PROCESS FLOW

(71) Applicant: Apple Inc., Cupertino, CA (US)

(72) Inventors: Jun Zhai, Cupertino, CA (US);
Kunzhong Hu, Cupertino, CA (US);
Kwan-Yu Lai, Campbell, CA (US);
Mengzhi Pang, Cupertino, CA (US);
Chonghua Zhong, Cupertino, CA (US);
Se Young Yang, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/638,925

(22) Filed: Mar. 4, 2015

(65) Prior Publication Data

US 2016/0260684 A1 Sep. 8, 2016

(51) Int. Cl.
*H01L 25/065* (2006.01)
*H01L 25/00* (2006.01)
(Continued)

(52) U.S. Cl.
CPC ........ *H01L 25/0652* (2013.01); *H01L 21/568* (2013.01); *H01L 23/3135* (2013.01); *H01L 23/5389* (2013.01); *H01L 24/19* (2013.01); *H01L 24/96* (2013.01); *H01L 25/50* (2013.01); *H01L 2224/04105* (2013.01); *H01L 2224/08167* (2013.01); *H01L 2224/12105* (2013.01); *H01L 2224/131* (2013.01); *H01L 2224/2732* (2013.01); *H01L 2224/27318* (2013.01); *H01L 2224/27436* (2013.01); *H01L 2224/2919* (2013.01); *H01L 2224/32225* (2013.01); *H01L 2224/73267* (2013.01); *H01L 2224/81193* (2013.01); *H01L 2224/83191* (2013.01); *H01L 2224/83855* (2013.01);
(Continued)

(58) Field of Classification Search
CPC . H01L 25/0652; H01L 25/50; H01L 23/3135; H01L 21/568; H01L 23/5389; H01L 24/19; H01L 24/96
See application file for complete search history.

(56) References Cited

U.S. PATENT DOCUMENTS

| | | | |
|---|---|---|---|
| 7,763,976 B2 | 7/2010 | Tang et al. | |
| 8,669,140 B1 * | 3/2014 | Muniandy | ............ H01L 21/568 257/774 |

(Continued)

OTHER PUBLICATIONS

Yoon et al., "Fanout Flipchip eWLB (embedded Wafer Level Ball Grid Array) Technology as 2.5D Packaging Solutions," 2013 Electronic Components & Technology Conference, IEEE, 2013, pp. 1855-1860.

(Continued)

*Primary Examiner* — Long Pham
(74) *Attorney, Agent, or Firm* — Blakely, Sokoloff, Taylor & Zafman LLP

(57) ABSTRACT

Packages and methods of formation are described. In an embodiment, a system in package (SiP) includes first and second redistribution layers (RDLs), and a plurality of die attached to the front and back side of the first RDL. The first and second RDLs are coupled together with a plurality of conductive pillars extending from the back side of the first RDL to a front side of the second RDL.

16 Claims, 12 Drawing Sheets

(51) Int. Cl.
*H01L 23/31* (2006.01)
*H01L 21/56* (2006.01)
*H01L 23/538* (2006.01)
*H01L 23/00* (2006.01)

(52) U.S. Cl.
CPC ............ *H01L 2224/83862* (2013.01); *H01L 2224/83874* (2013.01); *H01L 2224/92244* (2013.01); *H01L 2224/94* (2013.01); *H01L 2225/0652* (2013.01); *H01L 2225/06517* (2013.01); *H01L 2225/06524* (2013.01); *H01L 2225/06572* (2013.01); *H01L 2924/1431* (2013.01); *H01L 2924/1433* (2013.01); *H01L 2924/1434* (2013.01); *H01L 2924/1436* (2013.01); *H01L 2924/1461* (2013.01); *H01L 2924/18161* (2013.01); *H01L 2924/18162* (2013.01); *H01L 2924/19041* (2013.01); *H01L 2924/19042* (2013.01); *H01L 2924/19105* (2013.01)

(56) References Cited

U.S. PATENT DOCUMENTS

| | | |
|---|---|---|
| 8,822,268 B1 | 9/2014 | Magnus |
| 8,890,329 B2 | 11/2014 | Kim et al. |
| 2011/0037169 A1 | 2/2011 | Pagaila |
| 2013/0037950 A1 | 2/2013 | Yu et al. |
| 2013/0043584 A1* | 2/2013 | Kwon ............... H01L 23/49822 257/737 |
| 2013/0154091 A1 | 6/2013 | Wright et al. |
| 2014/0054760 A1 | 2/2014 | Yu et al. |
| 2014/0103488 A1* | 4/2014 | Chen ..................... H01L 24/83 257/532 |
| 2014/0185264 A1* | 7/2014 | Chen ................... H01L 23/3128 361/814 |
| 2014/0197530 A1 | 7/2014 | Meyer et al. |
| 2014/0239497 A1 | 8/2014 | Yap |
| 2015/0001709 A1 | 1/2015 | Bao et al. |
| 2015/0243633 A1* | 8/2015 | Chen ................. H01L 25/0657 257/774 |
| 2016/0079220 A1* | 3/2016 | Lin ..................... H01L 25/0652 361/783 |

OTHER PUBLICATIONS

PCT Invitation to Pay Additional Fees for International Application No. PCT/US2016/018804, mailed May 25, 2016, 10 pages.
PCT International Search Report and Written Opinion for International Application No. PCT/US2016/018804, mailed Sep. 9, 2016, 24 pages.

* cited by examiner

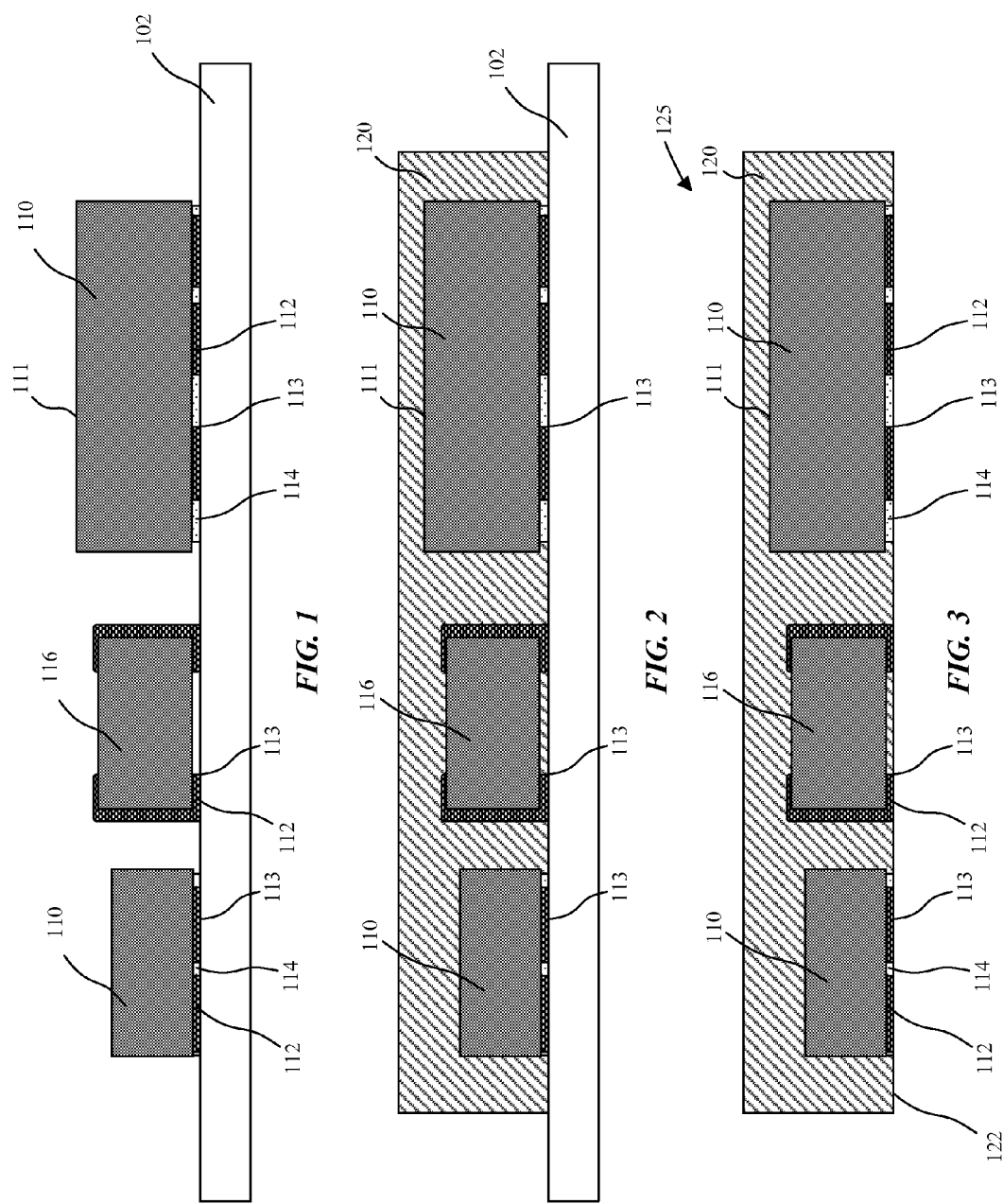

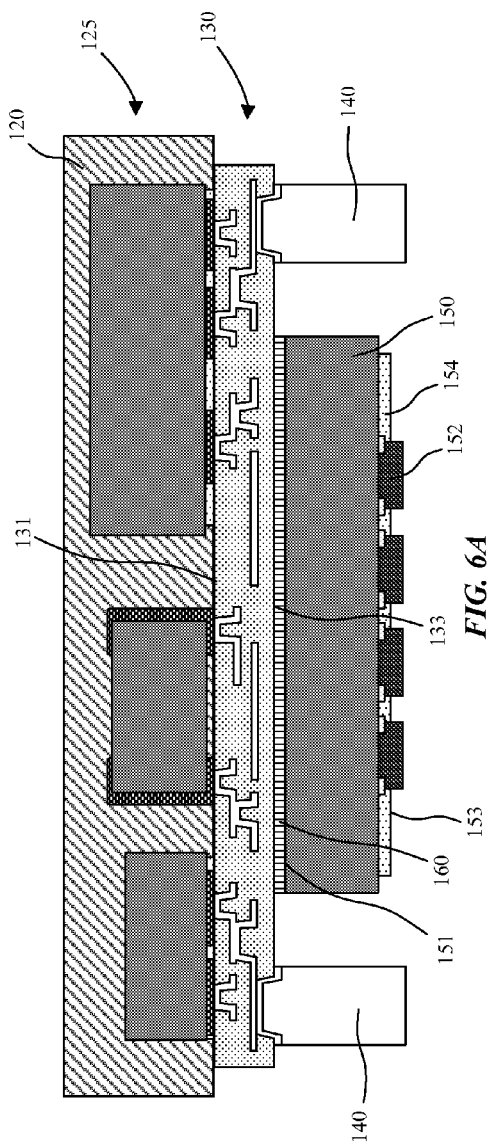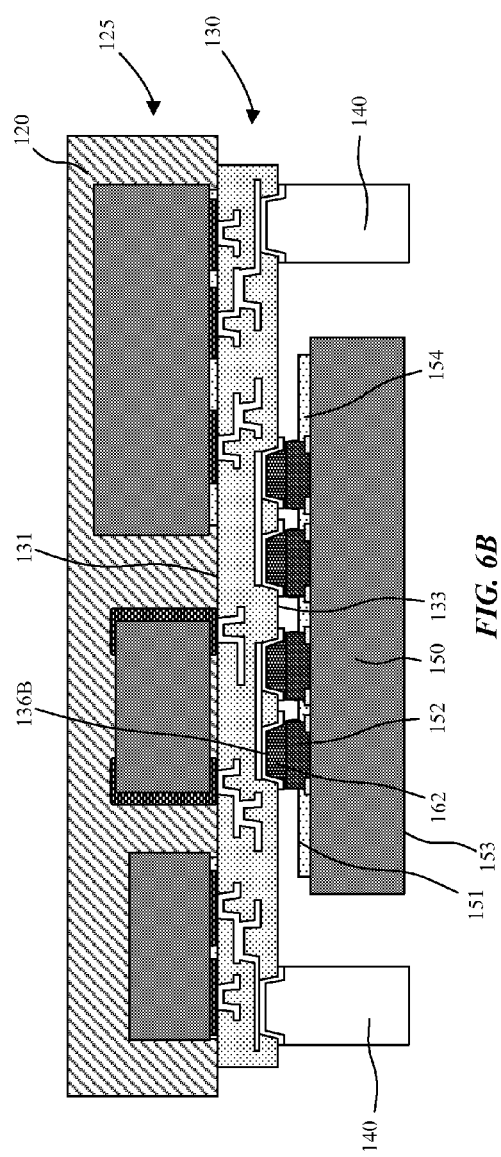

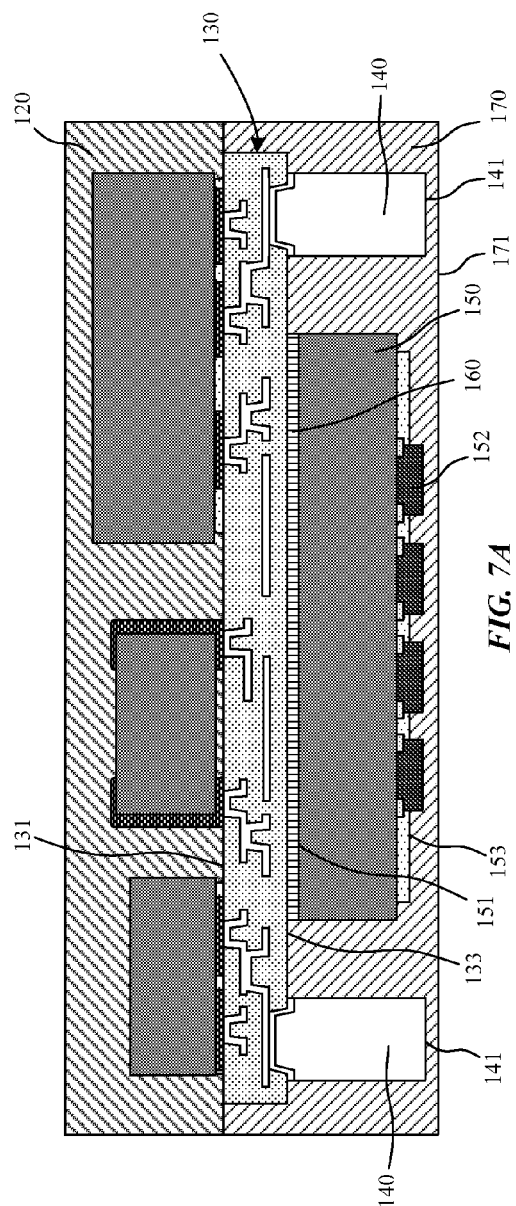
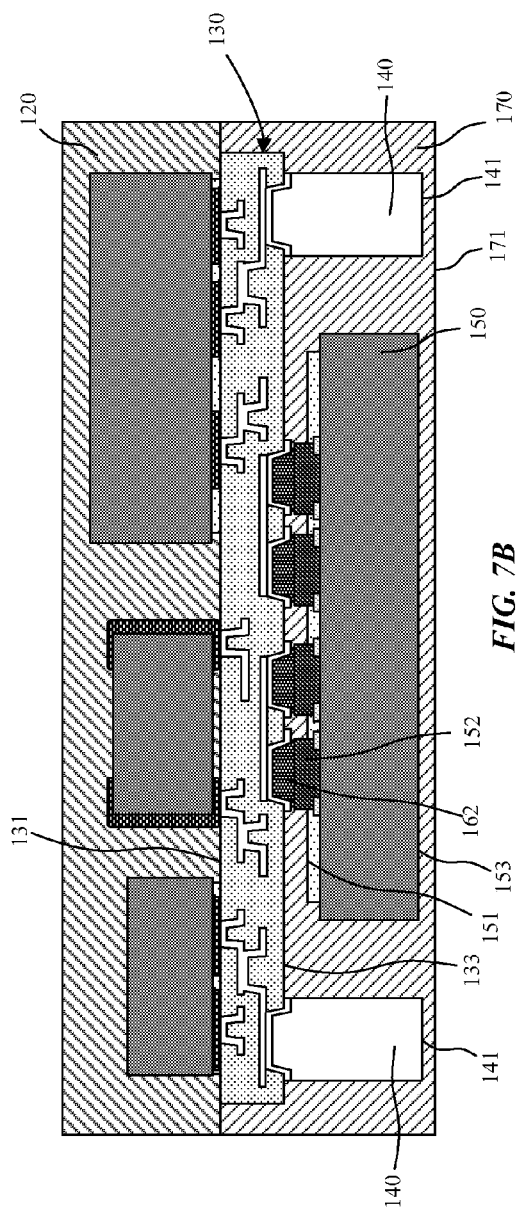
FIG. 7A
FIG. 7B

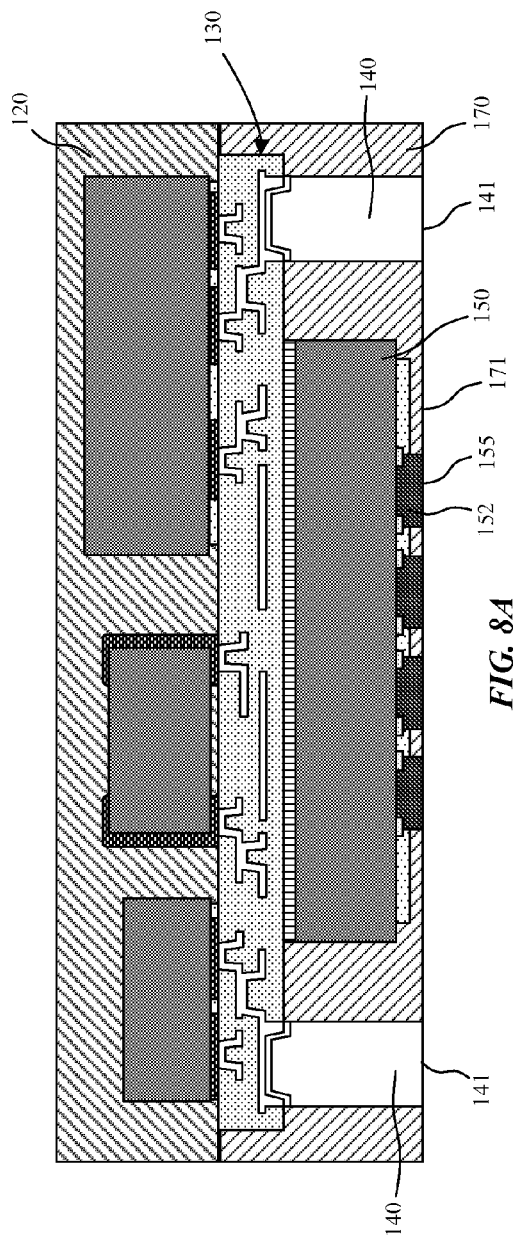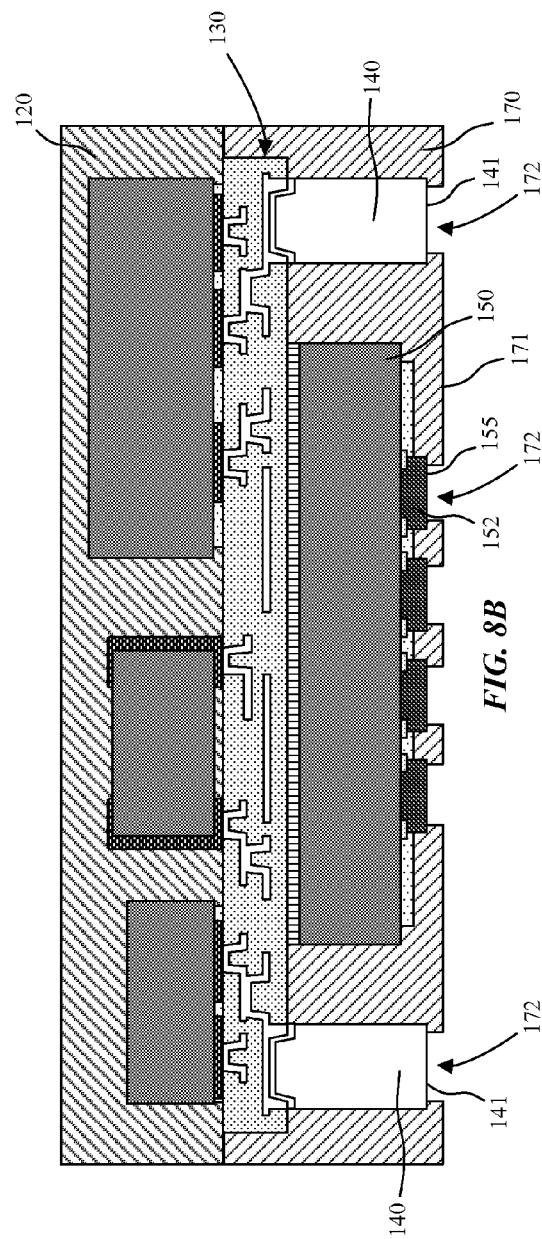
FIG. 8A
FIG. 8B

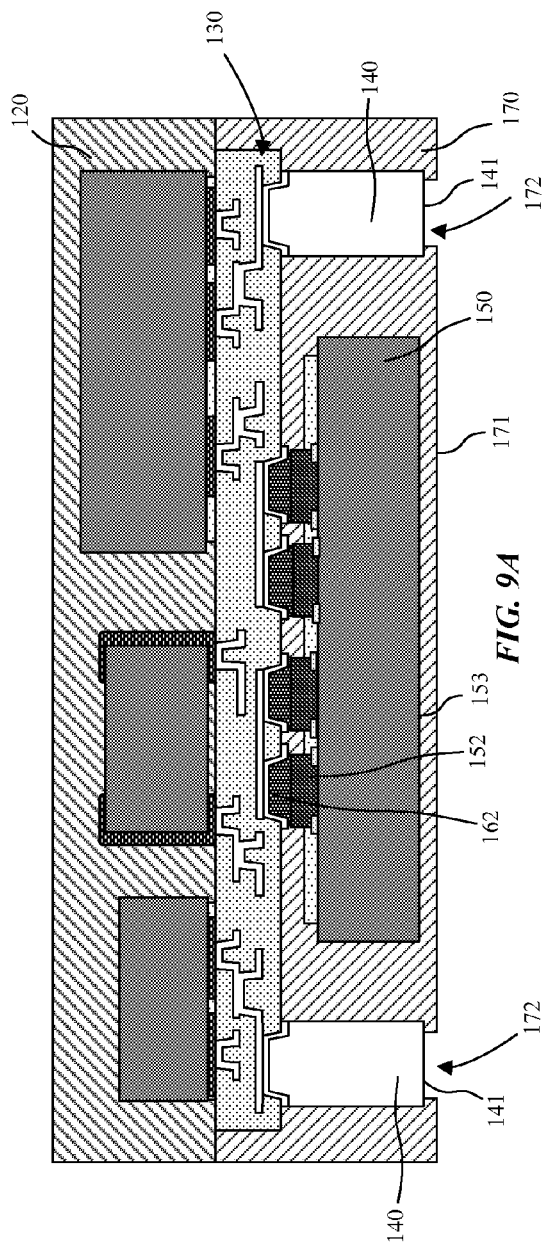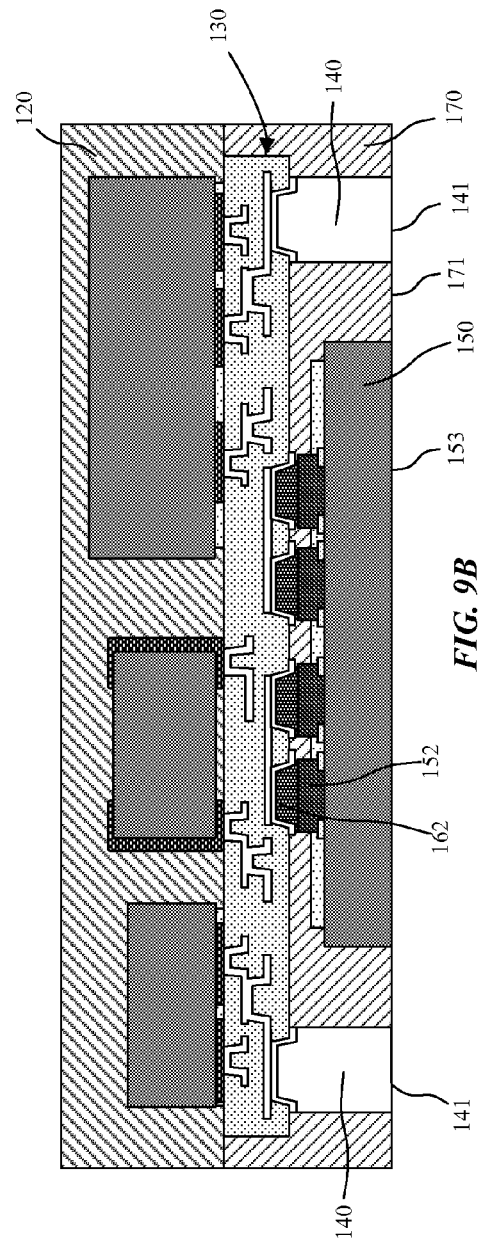

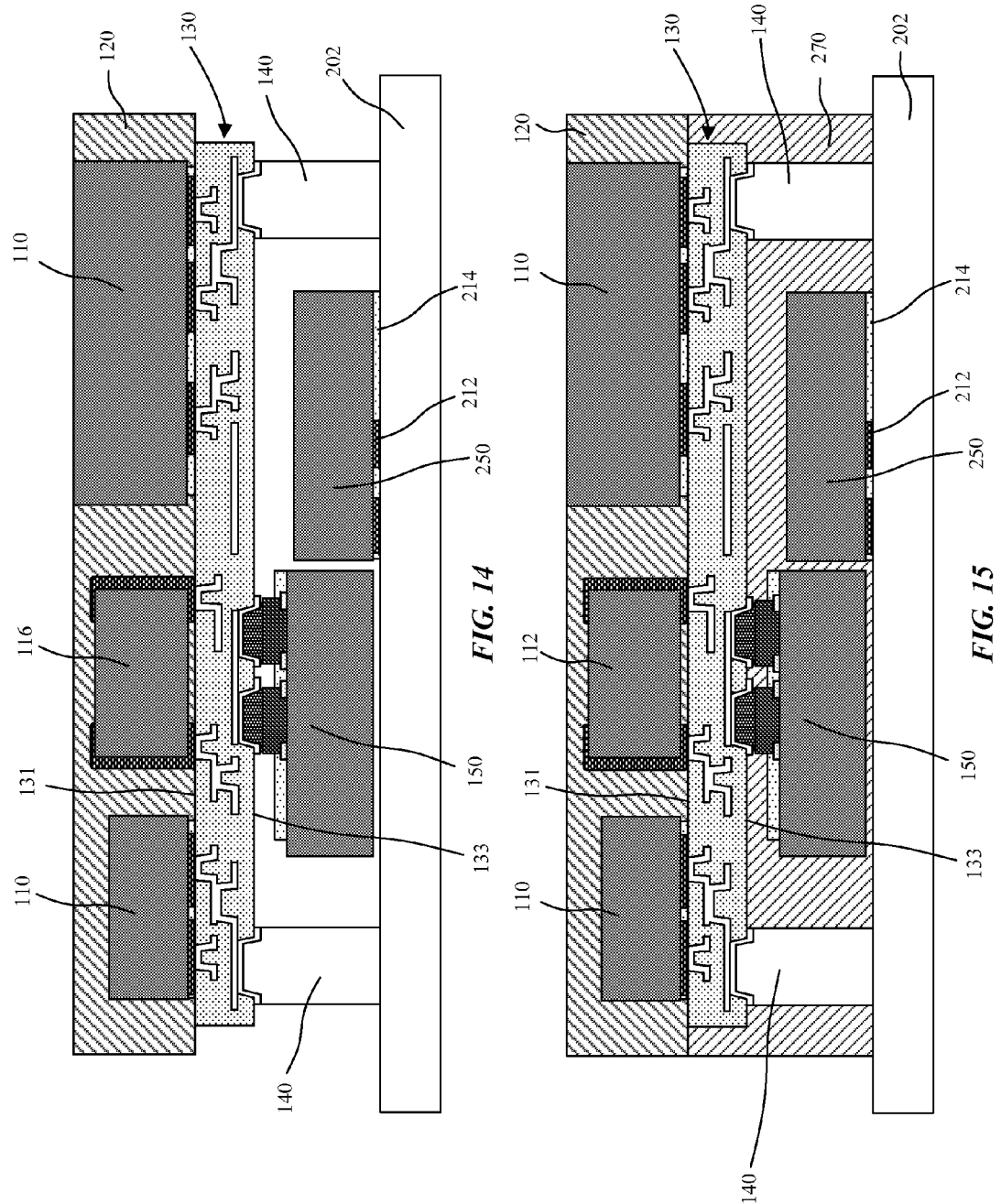

SYSTEM IN PACKAGE FAN OUT STACKING ARCHITECTURE AND PROCESS FLOW

BACKGROUND

Field

Embodiments described herein relate to semiconductor packaging. More particularly, embodiments relate to system in package (SiP) structures and methods of fabrication.

Background Information

The current market demand for portable and mobile electronic devices such as mobile phones, personal digital assistants (PDAs), digital cameras, portable players, gaming, and other mobile devices requires the integration of more performance and features into increasingly smaller spaces. As a result, various multiple-die or component packaging solutions such as system in package (SiP) have become more popular to meet the demand for higher die/component density devices. There are many different possibilities for arranging multiple die in an SiP. For example, vertical integration of die in SiP structures has evolved into 2.5D solutions and 3D solutions. In 2.5D solutions the multiple die may be flip chip bonded on an interposer that includes through vias as well as fan out wiring. In 3D solutions multiple die may be stacked on top of one another on an SiP substrate, and connected with off-chip wire bonds or solder bumps.

There are additionally various degrees of SiP integration for an integrated product. In one implementation a number of small SiPs are mounted in a larger SiP, which is known as a package in package (PiP). In another implementation an SiP is mounted on top of another SiP, which is known as a package on package (PoP). SiP and PoP structures may be assembled on an interposer to fan out electrical terminals for an integrated product.

SUMMARY

Fan out system in package (SiP) structures and methods of fabrication are described. In an embodiment, a package includes a first (e.g. top) redistribution layer (RDL) and a first (e.g. top) die attached to a front side of the first RDL. A redistribution line of the first RDL is formed directly on a first contact pad along a bottom surface of the first die. A first molding compound encapsulates the first die on the front side of the first RDL. A top surface of a second (e.g. bottom) die is attached to a back side of the first RDL. A plurality of conductive pillars 140 extends from the back side of the first RDL to a front side of a second RDL, and a second molding compound encapsulates the second die and the plurality of conductive pillars between the back side of the first RDL and the front side of the second RDL. A plurality of conductive bumps may be formed on a back side of the second RDL.

In an embodiment, the first molding compound does not completely cover a top surface of the first die. In an embodiment, the second molding compound does not completely cover a bottom surface of the second die adjacent the second RDL. In such configurations, this may allow for reduction of overall z-height of the package. Forming redistribution lines directly on contact pads of the die may also reduce z-height. Electrical routing the through use of RDLs may additionally contribute to the reduction of package z-height. In an embodiment, the second RDL includes another redistribution line formed directly on one of the plurality of conductive pillars.

The second (bottom) die may be back facing or upward facing toward the first RDL. In an embodiment, the second die is attached to the first RDL with a die attach film. For example, such a second die may be back facing. The second RDL may include another redistribution line formed directly on a conductive contact of a back facing second die. In an embodiment, a bottom surface of a conductive contact of the back facing second die and bottom surfaces of the array of conductive pillars are coplanar.

In an embodiment, the second die is bonded to the first RDL with a solder bump. For example, such a second die may be upward facing. In an embodiment, the second molding compound does not completely cover a bottom surface of the upward facing second die adjacent the second RDL.

In an embodiment, a third die may be attached to the front side of the second RDL. The third die may be encapsulated in the molding compound along with the second (bottom) die and the plurality of conductive pillars. In an embodiment, another redistribution line of the second RDL is formed directly on a third contact pad along a bottom surface of the third die.

In an embodiment, a method of forming a fan out system in package includes placing a first die (e.g. top die) on a carrier substrate, encapsulating the first die on the carrier substrate with a first molding compound, removing the carrier substrate, and forming a first redistribution layer (RDL) on the first molding compound and the first die. A redistribution line of the first RDL may be formed directly on a contact pad along a bottom surface of the first die. A plurality of conductive pillars may be formed on a back side of the first RDL, and second die attached to the back side of the first RDL inside a perimeter of the plurality of conductive pillars. The second die and the plurality of conductive pillars may then be encapsulated with a second molding compound, followed by the formation of a second RDL on the second molding compound and the plurality of conductive pillars. In an embodiment, a thickness of the first molding compound is reduced to expose the first die, and optionally a thickness of the first die is reduced. In an embodiment, a thickness of the second molding compound and the plurality of conductive pillars is reduced after encapsulating the second die and the plurality of conductive pillars in the second molding compound, and prior to forming the second RDL. A thickness of the second die may also optionally be reduced. In an embodiment, openings are formed in the second molding compound to expose lading pads of the second die prior to forming the second RDL.

Forming the second RDL may include forming a plurality of redistribution lines directly on the plurality of conductive pillars. Forming the second RDL may include forming a redistribution line directly on a contact pad of the second die. In an embodiment, a back facing second die is attached to the first RDL with an adhesive layer.

In an embodiment, a second carrier substrate may be used during formation of the package. This may include placing a third die or component on a second carrier substrate, and encapsulating the third die or component with the second molding compound on the carrier substrate. The second carrier substrate may be removed after encapsulating the second die, the plurality of conductive pillars, and the third die or component with the second molding compound, followed by forming the second RDL on the third die or component, the second molding compound, and the plurality of conductive pillars.

BRIEF DESCRIPTION OF THE DRAWINGS

FIG. 1 is a cross-sectional side view illustration of a plurality of die and a component mounted on a carrier substrate in accordance with an embodiment.

FIG. 2 is a cross-sectional side view illustration of a plurality of die and a component encapsulated in a molding compound in accordance with an embodiment.

FIG. 3 is a cross-sectional side view illustration of a reconstituted structure after removal of a carrier substrate in accordance with an embodiment.

FIG. 6A is a cross-sectional side view illustration of a back facing die attached to a top RDL in accordance with an embodiment.

FIG. 6B is a cross-sectional side view illustration of an upward facing die attached to a top RDL in accordance with an embodiment.

FIG. 7A is a cross-sectional side view illustration of a back facing die and plurality of conductive pillars encapsulated in a molding compound in accordance with an embodiment.

FIG. 7B is a cross-sectional side view illustration of an upward facing die and plurality of conductive pillars encapsulated in a molding compound in accordance with an embodiment.

FIG. 8A is a cross-sectional side view illustration of an encapsulated back facing die and plurality of conductive pillars with exposed surfaces in accordance with an embodiment.

FIG. 8B is a cross-sectional side view illustration of a selectively patterned molding compound in accordance with an embodiment.

FIG. 9A is a cross-sectional side view illustration of a selectively patterned molding compound in accordance with an embodiment.

FIG. 9B is a cross-sectional side view illustration of an encapsulated upward facing die and plurality of conductive pillars with exposed surfaces in accordance with an embodiment.

FIGS. 14-16 are cross-sectional side view illustrations of a method of forming a packaging using multiple carrier substrates in accordance with an embodiment.

DETAILED DESCRIPTION

Figure 4:
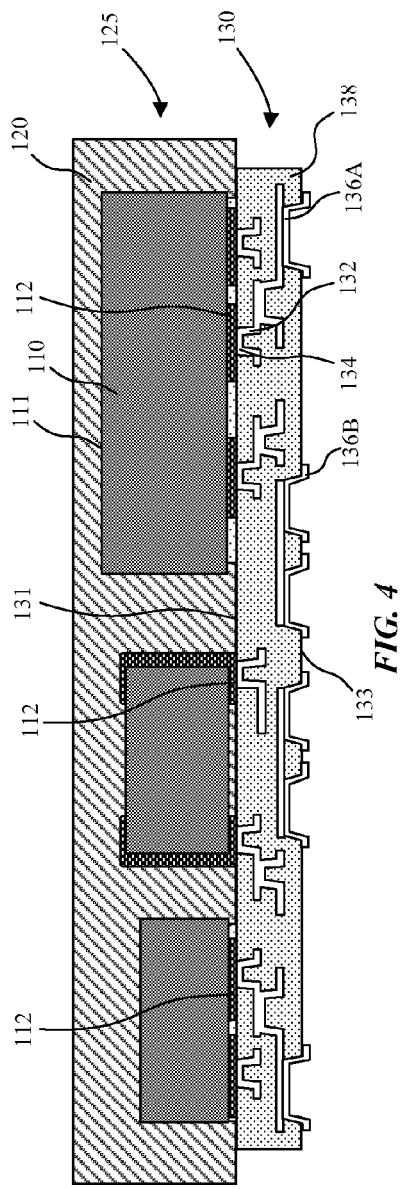
FIG. 4 is a cross-sectional side view illustration of a top RDL formed on a reconstituted structure in accordance with an embodiment.

Embodiments describe fan out system in package (SiP) structures and methods of fabrication, particularly methods utilizing fan out wafer level packaging (FOWLP) techniques. In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", and "on" as used herein may refer to a relative position of one layer with respect to other layers. One layer "above", "over", or "on" another layer or bonded "to" or in "contact" with another layer may be directly in contact with the other layer or may have one or more intervening layers. One layer "between" layers may be directly in contact with the layers or may have one or more intervening layers.

In one aspect, embodiments describe SiP structures that leverage redistribution layers (RDLs) for the fan out of electrical terminals of multiple die. Such a configuration may allow for fan out of each individual die with a corresponding RDL. Furthermore, such a configuration may allow for dissimilar die integration such as logic/memory (e.g. application-specific integrated circuit (ASIC)/dynamic random-access memory (DRAM)) without additional silicon or organic interposers commonly used in PoP and SiP integration.

Specifically, in an embodiment a stacked die arrangement includes a top die bonded to a front side of a top redistribution layer (RDL) for fan out, and a bottom die bonded to a back side of the top RDL. The top RDL is located over and electrically coupled to a lower RDL with a plurality of conductive pillars. Thus, embodiments describe an SiP structure with a two sided RDL arrangement in which die are attached to both the front and back sides of the top RDL. In an embodiment, a redistribution line of the top RDL is formed directly on a first contact pad along a bottom surface of the top die. Such a configuration may allow for the reduction of total package z-height by eliminating solder bumping the top die, for example as with conventional flip chip attachment processes. In one aspect, embodiments describe a process flow for fabricating an SiP structure with multiple RDLs that utilizes a single carrier substrate. In such a process flow, the use of a single carrier substrate as opposed to multiple carrier substrates allows for the formation of the top RDL directly on the top die, thus contributing the overall reduction in z-height.

In other aspects, embodiments describe a two sided RDL arrangement that disconnects a thickness correlation of die to vertical conductors commonly found in PoP solutions, where such a thickness correlation describes a standoff height between the bottom die and a routing layer above the bottom die. In accordance with embodiments, such a standoff height is eliminated by attaching the bottom die to a back side of the top RDL, and thus total package z-height may be reduced. Furthermore in some embodiments the bottom die thickness may be thinned after attachment to the top RDL further contributing to total package z-height reduction. Likewise, top die thickness may also be thinned in accordance with embodiments, further contributing to total package z-height reduction.

In the following description and figures, various process flows are illustrated and described for fabricating an SiP structure. While single SiP structures are illustrated in the figures, it is to be appreciated that these may be repeating structures across a carrier substrate, or reconstituted wafer/panel in accordance with FOWLP techniques.

Referring now to FIG. 1, a cross-sectional side view illustration is provided of a plurality of die 110, and optionally components 116, mounted on a carrier substrate 102, such as a silicon wafer, glass panel, metal panel, etc. The carrier substrate 102 may additionally include an adhesive layer for mounting the plurality of die, and component(s). In an embodiment each die 110 or component 116 includes a bottom surface 113 with one or more exposed contact pads 112, and optionally passivation layer 114. In an embodiment, die 110 may be logic, memory, or other die. In an embodiment, die 110 are memory (e.g. DRAM) die. Components 116 may be passive devices such as capacitors or inductors, MEMS devices, sensors, etc.

As shown in FIG. 2, the plurality of die 110 and optional component(s) 116 are then encapsulated in a first molding compound 120 on the carrier substrate 102. For example, the first molding compound 120 may include a thermosetting cross-linked resin (e.g. epoxy), though other materials may be used as known in electronic packaging. Encapsulation may be accomplished using a suitable technique such as, but not limited to, transfer molding, compression molding, and lamination. As used herein, "encapsulated" does not require all surfaces to be encased within a molding compound. In the embodiment illustrated in FIG. 2 the lateral sides of die 110 and component 116 are encased in the molding compound 120 and the molding compound is also formed over the top surface 111 of tallest die 110, though it is not required for the molding compound to cover the top surface 111 of the tallest die 110 or component 116. In an embodiment, the molding compound 120 is continuous across the carrier substrate 102, covering a plurality of groupings of die 110, component(s) 116 corresponding to separate SiPs that will subsequently be singulated.

The carrier substrate 102, including any optional adhesive layer, may then be removed to expose the bottom surfaces 113 of the die 110 and optional component 116 as illustrated in FIG. 3, resulting in the formation of a reconstituted wafer or panel 125. Given the method of manufacture, in an embodiment a bottom surface 122 of the first molding compound 120 may be coplanar with the bottom surfaces 113 of the die 110, and component(s) 116, and thus the exposed surfaces of the contact pads 112 and passivation layer 114 corresponding to the bottom surfaces 113 of the die 110.

Referring now to FIG. 4, a first redistribution layer (RDL) 130 is formed on the reconstituted wafer/panel 125 of FIG. 3, with a front surface 131 of the first RDL 130 formed on the first molding compound 120 and the one or more die 110 and component(s) 116. The first RDL 130 may include a single redistribution line 132 or multiple redistribution lines 132 and dielectric layers 138. The first RDL 130 may be formed by a layer-by-layer process, and may be formed using thin film technology. In an embodiment, the first RDL 130 has total a thickness of less than 50 µm, or more specifically less than 30 µm, such as approximately 20 µm.

In an embodiment, first RDL 130 includes embedded redistribution lines 132 (embedded traces). For example, the redistribution lines 132 may be created by first forming a seed layer, followed by forming a metal (e.g. copper) pattern. Alternatively, redistribution lines may be formed by deposition (e.g. sputtering) and etching. The material of redistribution lines 132 can include, but are not limited to, a metallic material such as copper, titanium, nickel, gold, and combinations or alloys thereof. The metal pattern of the redistribution lines 132 is then embedded in a dielectric layer 138, which is optionally patterned. The dielectric layer 138 may be any suitable material such as an oxide, or polymer (e.g. polyimide).

Figure 5:
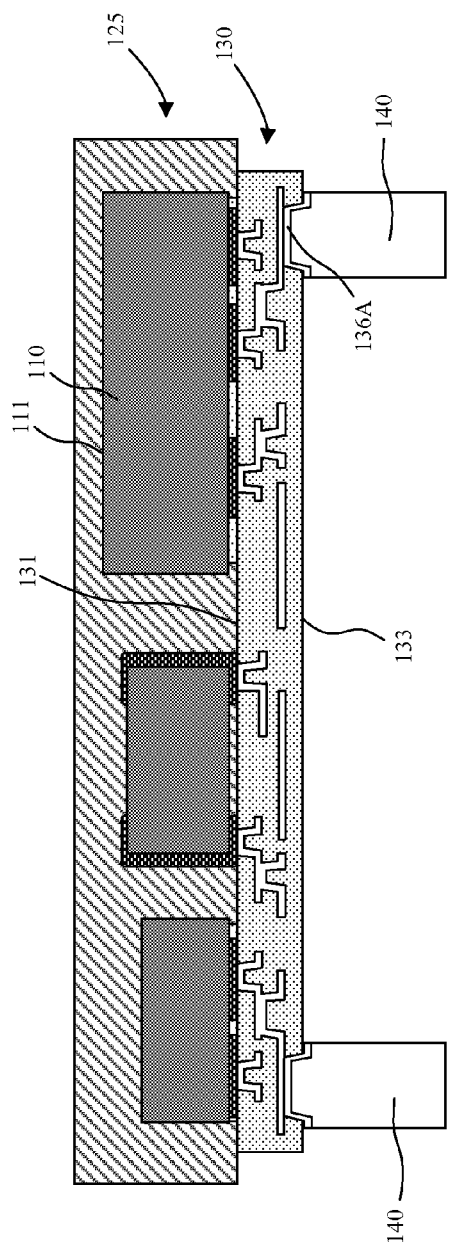
FIG. 5 is a cross-sectional side view illustration of the formation of conductive pillars on a top RDL in accordance with an embodiment.

In the embodiment illustrated, redistribution lines 132 are formed directly on the contact pads 112 along the bottom surfaces 113 of the die 110 and component 116. More specifically, contact pads 134 of the redistribution lines 132 are formed directly on the contact pads 112. In an embodiment, the back side 133 of the first RDL 130 includes contact pads or under bump metallurgy (UBM) pads. For example, UBM pads 136B are formed for bonding with additional die, and UBM pads 136A are formed as seed layers for growth of conductive pillars 140, as illustrated in FIG. 5. The material of conductive pillars 140 can include, but is not limited to, a metallic material such as copper, titanium, nickel, gold, and combinations or alloys thereof. Conductive pillars 140 may be formed using a suitable processing technique, and may be formed of a variety of suitable materials (e.g. copper) and layers. In an embodiment, conductive pillars 140 are formed by a plating technique, such as electroplating using a patterned photoresist layer to define the pillar structure dimensions, followed by removal of the patterned photoresist layer.

Referring now to FIGS. 6A-6B, one or more bottom die 150 are attached to the back side 133 of the first RDL 130 using the reconstituted wafer/panel 125 as a carrier. In a specific embodiment die 150 is a logic die, such as an ASIC die. In the embodiment illustrated, die 150 is attached to the first RDL 130 within a periphery of the plurality of conductive pillars 140. In accordance with embodiments, the bottom die 150 can be either facing back (FIG. 6A) to the first RDL 130 and the reconstituted wafer/panel 125, or upward facing (FIG. 6B) toward the first RDL 130 and the reconstituted wafer/panel 125.

In the embodiment illustrated in FIG. 6A, a top surface 151 of die 150 is attached to the back side 133 of the first RDL 130 with a die attach film 160. In this configuration, the die is facing back to the reconstituted wafer/panel 125. For example, the die attach film 160 may be applied to an array of die 150 prior to singulation and attachment to the first RDL 130. For example, the die attach film 160 can be applied by laminating, printing or dispensing. In an embodiment, die attach film 160 is formed of an adhesive material. Die attach film 160 may additionally be a thermally conductive adhesive for thermal dissipation. The die attach film 160 may optionally be cured after die attachment through chemical, thermal or ultraviolet light, for example. In an embodiment illustrated in FIG. 6A, the die 150 may not be directly electrically coupled to the first RDL 130. As illustrated, the bottom surface 153 of the die including a passivation layer 154 and conductive contacts 152 faces away from the first RDL 130. In the embodiment illustrated, conductive contacts 152 are formed as pillars, though this is not required.

In the embodiment illustrated in FIG. 6B, a top surface 151 of die 150 is attached to the back side 133 of the first RDL 130 with conductive bumps 162, such as solder bumps.

In this configuration, the die is upward facing toward to the reconstituted wafer/panel 125. The top surface 151 of the die 150 includes the conductive contacts 152 and passivation layer 154, and the die 150 is directly electrically coupled to the first RDL 130, for example to the landing pads or UBM pads 136B. In such an embodiment, the bottom surface 153 of the die does not include any conductive contacts 152.

Referring now to FIGS. 7A-7B, the bottom die 150 and conductive pillars 140 are encapsulated in a second molding compound 170 in accordance with embodiments. Second molding compound 170 can be the same material as the first molding compound 120. FIG. 7A is an illustration of the structure from FIG. 6A after encapsulation with the second molding compound 170 in an embodiment. FIG. 7B is an illustration of the structure from FIG. 6B after encapsulation with the second molding compound 170 in an embodiment. In the embodiments illustrated in FIGS. 7A-7B, a back side 171 of the molding compound 170 covers the bottom surfaces 153 of the bottom die 150, as well as the bottom surfaces 141 of the conductive pillars 140. However such a configuration is not required. Indeed the bottom surface of the die 150 and/or bottom surface of the conductive pillars 140 can be exposed after encapsulation.

Referring to FIG. 8A, an embodiment is illustrated in which the bottom die 150 is back facing, and the bottom surface 141 of the conductive pillars, and bottom surface 155 of the conductive contacts 152 of the bottom die 150 are exposed. This may be a result of the encapsulation process. This may alternatively be the result of etching or back-grinding, for example, by chemical mechanical polishing (CMP). As described above with regard to FIG. 6A, the conductive contacts 152 may be formed as pillars. A thickness of the pillar shaped conductive contacts 152 may be reduced during etching or back-grinding. In an embodiment, the back surface 171 of the second molding compound 170 is coplanar with the back surfaces of the conductive pillars 140 and surfaces 155 of the conductive contacts 152.

Embodiments are not limited to structures in which the exposed surfaces 155 of the conductive contacts 152 of the die 150 are coplanar with the back side 171 of the second molding compound 170. FIG. 8B is a cross-sectional side view illustration of a molding and patterning procedure. In the embodiment illustrated, the initial encapsulation operation may result in the molding compound 170 spreading over the die 150, and potentially over the conductive pillars 140. Following encapsulation, the molding compound 170 is patterned as illustrated in FIG. 8B to form openings 172 to expose the surfaces 155 of the conductive contacts 152 of the die 150 and/or the bottom surfaces 141 of the conductive pillars 140. Thus, rather than globally grinding or etching back, a selective patterning technique, such as laser drilling or chemical etching, can be used to expose the contact contacts 152 and conductive pillars 140.

Referring now to FIG. 9A, an embodiment is illustrated in which die 150 is upward facing toward the reconstituted wafer/panel. In such an embodiment, the molding compound 170 is selectively patterned to expose bottom surfaces 141 of the conductive pillars 140 using a suitable patterning technique. Referring to FIG. 9B, an embodiment is illustrated in which an etching or back-grinding operation (e.g. CMP) is performed to expose the bottom surfaces 141 of the conductive pillars 140. The back side 171 of the second molding compound 170 may be coplanar with the back surfaces of the conductive pillars 140 and optionally the bottom surface 153 of the die 150. The etching or back-grinding operation may additionally reduce a thickness of the second molding compound 170, conductive pillars 140, and optionally die 150. In this aspect, such a thickness reduction may translate to an overall z-height reduction of the completed SiP structure.

While FIGS. 6A-6B, 7A-7B, 8A-8B, and 9A-9B have been described separately, the processes are not necessarily exclusive from one another and may be combined in some embodiments, or may have variations. Taking FIG. 6A as an example, it can be diced into single units and placed on a carrier substrate.

Figure 10:
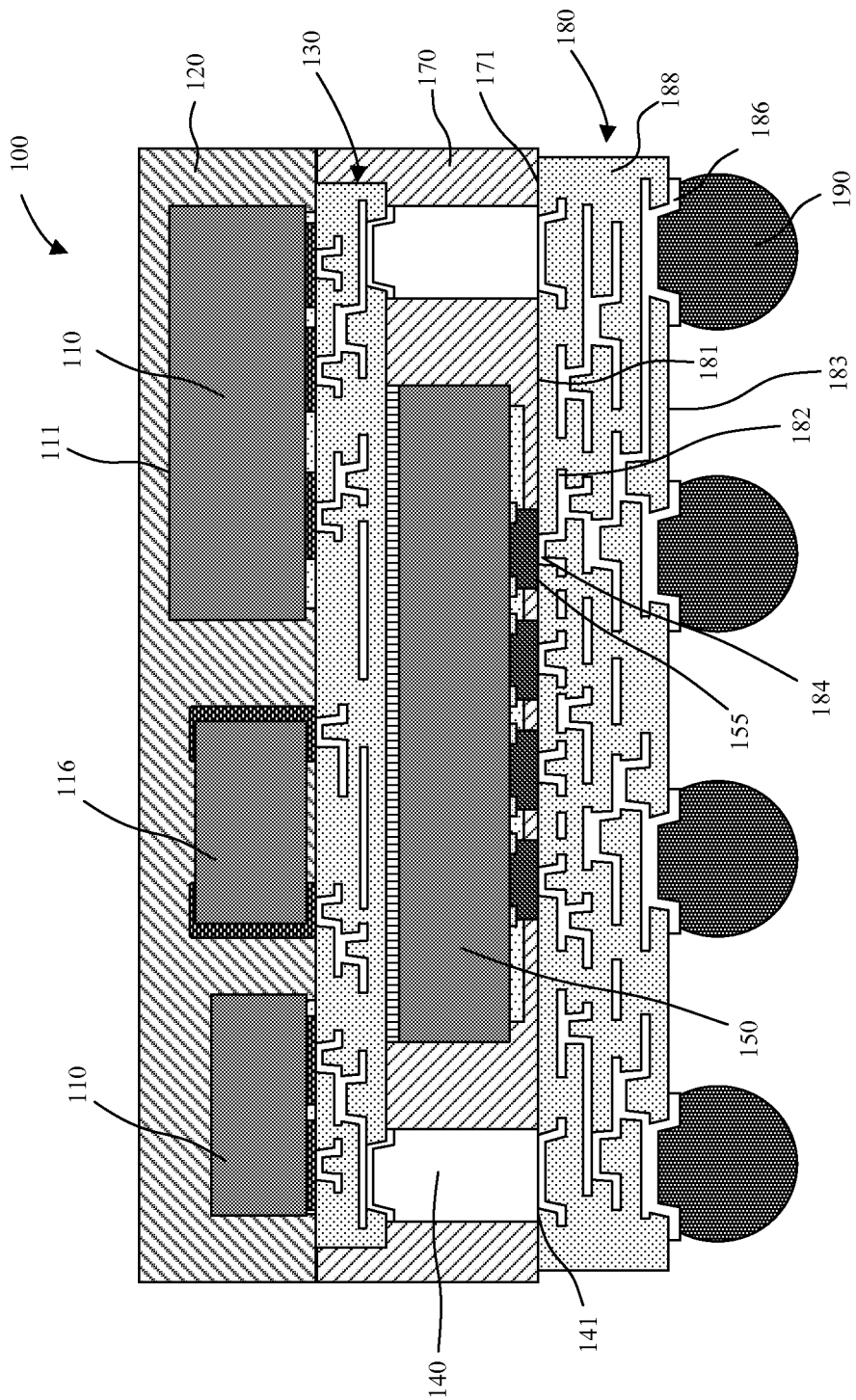
FIG. 10 is a cross-sectional side view illustration of a package including top and bottom RDLs in accordance with an embodiment.

Referring now to FIG. 10, in an embodiment with a back facing bottom die 150 a second RDL 180 is formed over the back side 171 of the second molding compound 170, exposed surfaces 155 of the conductive contacts 152 of the die 150, and the exposed bottom surfaces 141 of the conductive pillars 140. The second RDL 180 may be formed similarly as the first RDL 130, and may include single or multiple redistribution lines 182. The second RDL 180 may be formed by a layer-by-layer process, and may be formed using thin film technology. For example, the first RDL 130 and second RDL 180 can each have a thickness of less than 50 μm, or more specifically less than 30 μm, such as approximately 20 μm.

In an embodiment, the redistribution lines 182, and more specifically contact pads 184 of the redistribution lines 182, are formed directly on the exposed surfaces 155 of the conductive contacts 152 and the exposed bottom surfaces 141 of the conductive pillars 140. Thus, the die 150 is bonded to the second RDL 180 by virtue of the redistribution lines 182 and dielectric layers 188 that form the second RDL. In embodiments where die 150 is upward facing toward the reconstituted wafer/panel, the redistribution lines 182 are not formed directly on the conductive contacts 152 of the die 150, and the die 150 is not directly electrically coupled to the second RDL 180 as described in further detail below with regard to FIG. 12.

In accordance with embodiments, the two sided RDL arrangement may allow for a reduced total package thickness. For example, it is not necessary to include a standoff height, in which the conductive pillars 140 (vertical conductors) would be substantially taller than the bottom die 150. For example, it is not necessary to include a design tolerance to accommodate for the bonding of a top package to a bottom package with solder balls in a typical PoP solution, in which a conventional solder ball height is approximately 100-200 μm. Furthermore, the use of top and bottom RDL allows for fine line and spacing definition of the fan out of electrical terminals with a substantially lower thickness than a common interposer.

Following the formation of the second RDL 180, conductive bumps 190 may be attached to or grown on landing pads 186 (which can also be UBMs) of the second RDL 180, and individual packages 100 singulated. A variety of structures can be used for conductive bumps 190. For example, the conductive bumps 190 may be attached solder balls, as illustrated, or plated pillars.

Up until this point, the top surfaces 111 of top die 110 have been illustrated as being covered by the top surface 121 of the first molding compound 120. In the embodiments illustrated in FIGS. 11-13 the top surface 111 of at least one die 110 or component 116 is exposed, and not covered by the first molding compound 120. For example, this may be attributed to the initial encapsulation process, or alternatively accomplished through an etching or grind-back operation, which could be performed after the initial encapsulation process or after formation of the second RDL 180.

Figure 11:
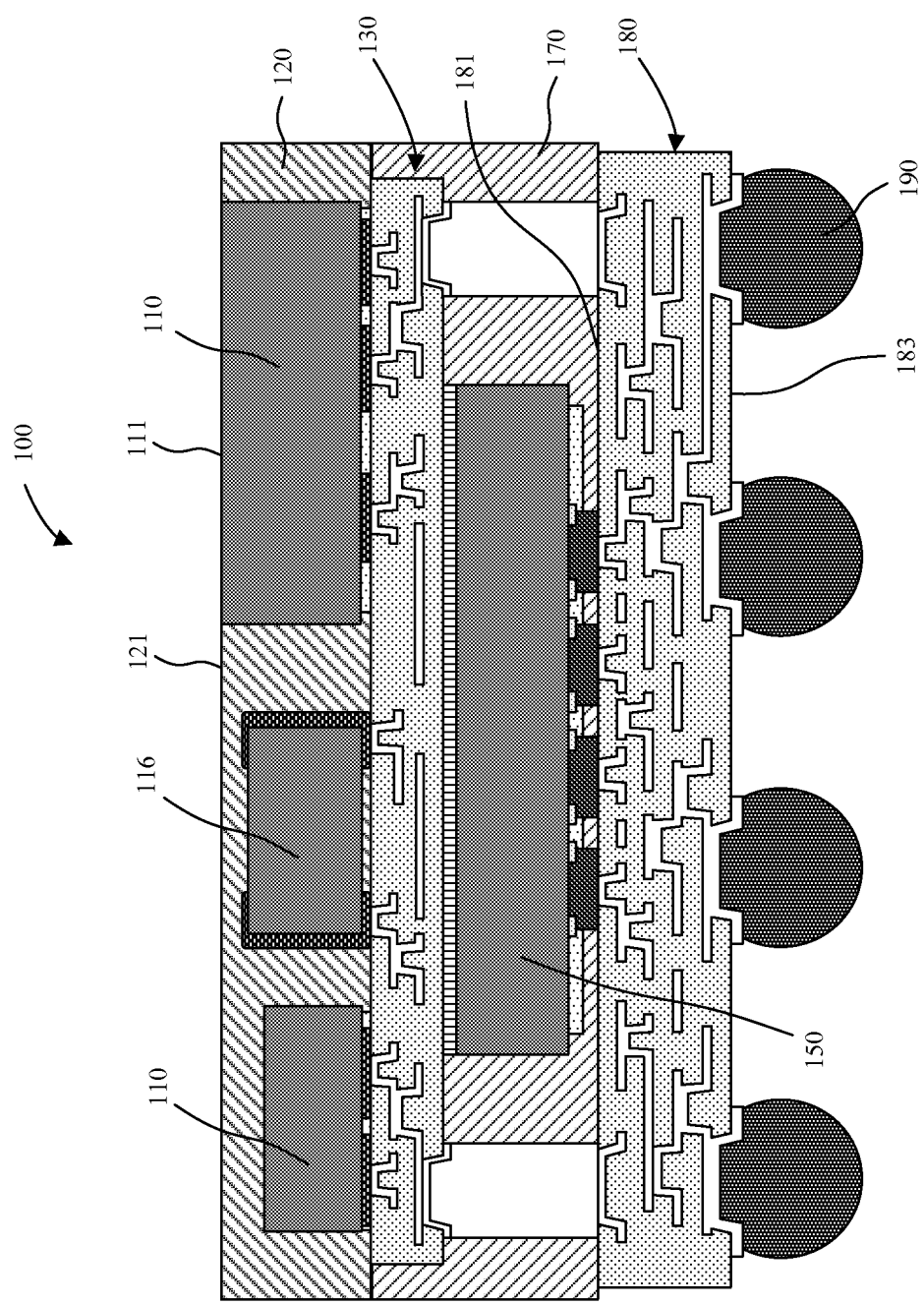
FIG. 11 is a cross-sectional side view illustration of a package including a back facing bottom die and a top die with an exposed top surface of in accordance with an embodiment.

FIG. 11 is a cross-sectional side view illustration of an embodiment with a back facing bottom die 150 similar to that described and illustrated with regard to FIG. 10 in which the top surface 111 of at least one die 110 or component 116 is exposed, and not covered by the first molding compound 120.

Figure 12:
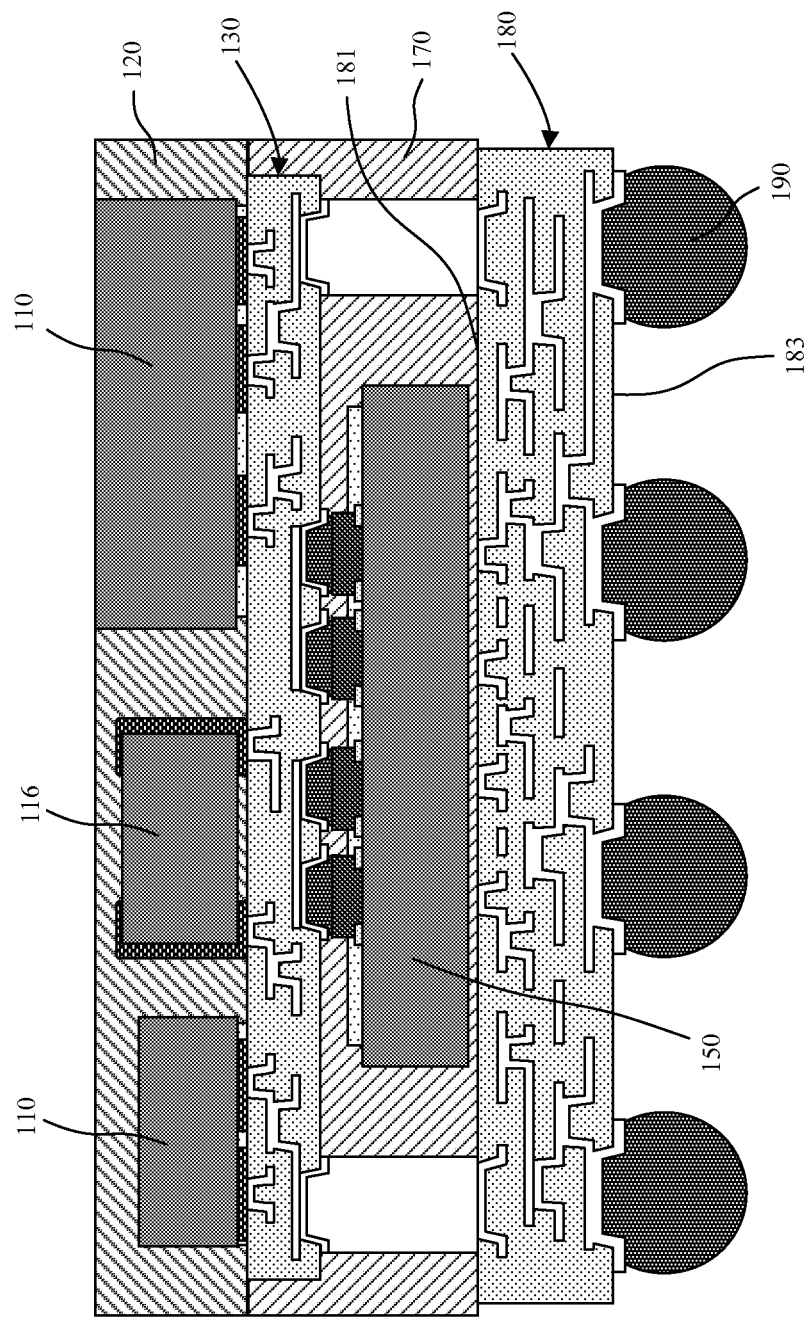
FIG. 12 is a cross-sectional side view illustration of a package including an upward facing bottom die and a top die with an exposed top surface of in accordance with an embodiment.

FIG. 12 is a cross-sectional side view illustration of an embodiment with an upward facing bottom die 150 similar to that described and illustrated with regard to FIG. 7B after the formation of a second RDL 180, and conductive bumps 190 in which the top surface 111 of at least one die 110 or component 116 is exposed, and not covered by the first molding compound 120. While not separately illustrated, the second RDL 180 may be formed over a variety of upward facing bottom die 150 configurations including, but not limited to those described and illustrated in FIGS. 9A-9B.

Figure 13:
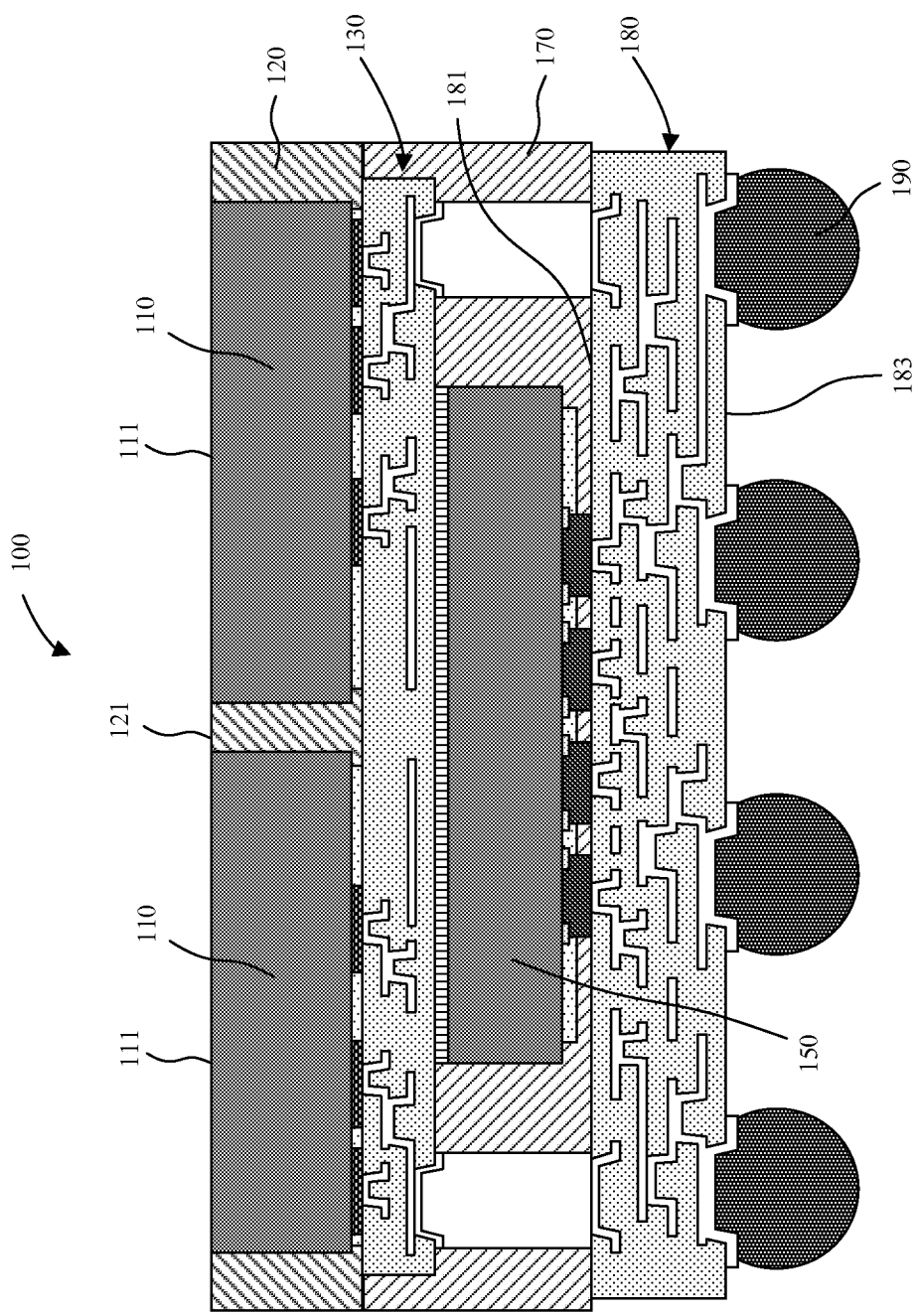
FIG. 13 is a cross-sectional side view illustration of a package including a plurality of top die with exposed top surfaces of in accordance with an embodiment.

FIG. 13 is a cross-sectional side view illustration of an embodiment including multiple top die 110 (or alternatively components 116) with exposed top surfaces 111 that are not covered by a top side 121 of the first molding compound 120. While the particular embodiment illustrated in FIG. 13 shows a back facing die 150, such an embodiment is likewise compatible with an upward facing bottom die 150.

It is to be appreciated that while specific package configurations have been described and illustrated with regard to FIGS. 10-13, that embodiments are not so limited and many of the configurations are combinable with each other, and other structures described herein, particularly where such combinations may contribute to a reduction in total package z-height.

Figure 16:
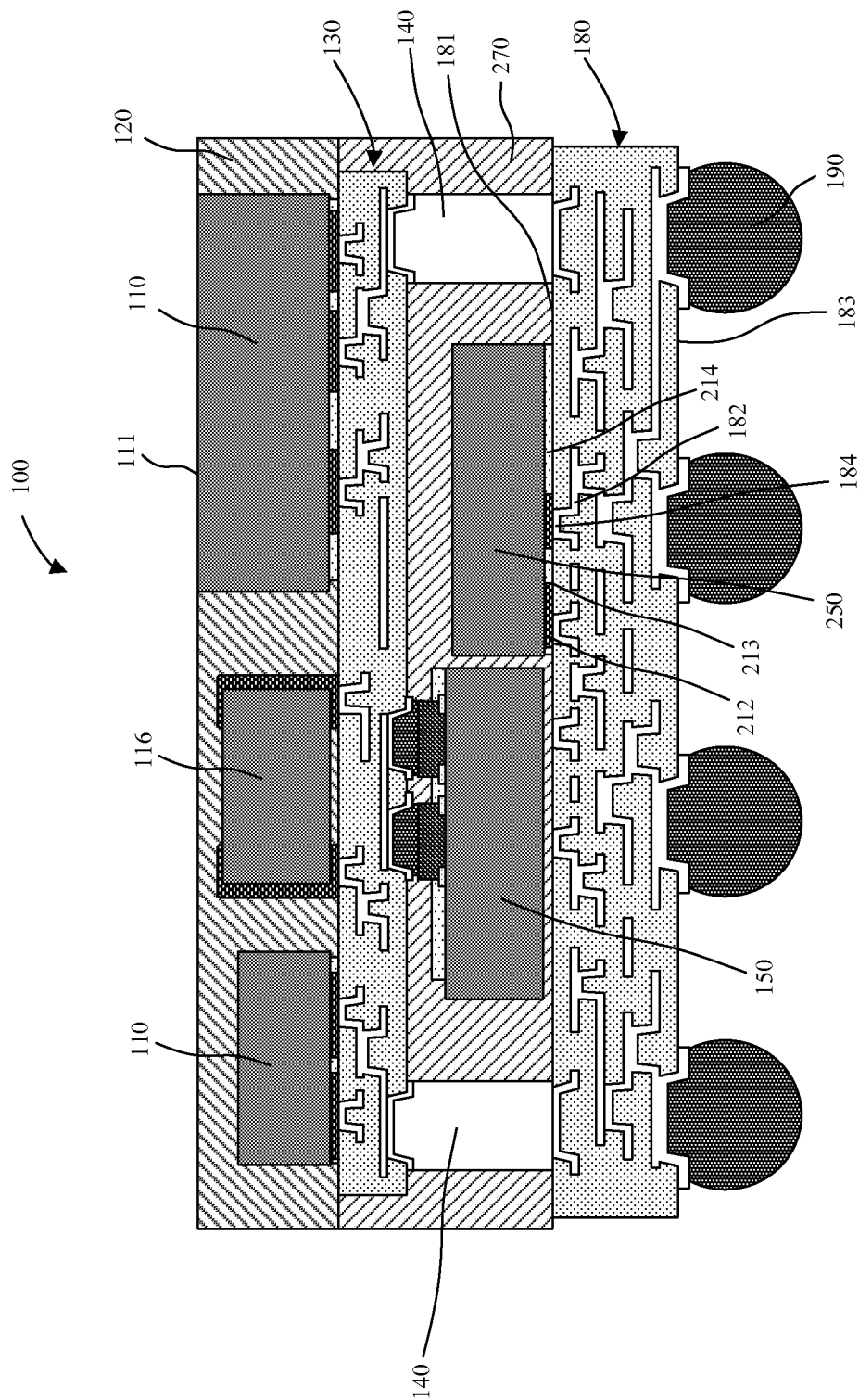

Referring now to FIGS. 14-16 a process flow is illustrated in accordance with an embodiment that utilizes an additional carrier substrate. In the embodiments described above, all die and components have been described and illustrated as being attached to the top RDL 130. Referring now the FIG. 14, in an embodiment a structure similar to that illustrated in FIG. 6B is temporarily placed on a carrier substrate 202 upon which a die 250 has been previously placed. Die 250 may be similar to die 150 previously described, including a bottom surface 213 with exposed contact pads 212 and passivation layer 214. The die 250 may also be replaced with a component similar to component 116 previously described.

After transfer to the carrier substrate 202, bottom die 150, 250 and conductive pillars 140 are encapsulated with a second molding compound 270. Referring now to FIG. 16, the carrier substrate 202 is removed and a second RDL 180 may then be formed as previously described with redistribution lines 182, and more specifically contact pads 184 of redistribution lines 182, formed directly on the contact pads 212 of the die 250. Following the formation of the second RDL 180, conductive bumps 190 may be attached and individual SiP structures 100 singulated as previously described.

In utilizing the various aspects of the embodiments, it would become apparent to one skilled in the art that combinations or variations of the above embodiments are possible for forming a system in package fan structures including multiple redistribution layers. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A package comprising:
    a first die including a bottom surface that includes a first contact pad and a passivation layer;
    a first redistribution layer (RDL);
    wherein the first die is attached to a front side of the first RDL such that the front side of the first RDL is directly on the first contact pad and the passivation layer;
    a first molding compound encapsulating the first die on the front side of the first RDL;
    a top surface of a second die attached to a back side of the first RDL with a die attach film such that the second die is facing back to the first RDL;
    a second RDL;
    a plurality of conductive pillars extending from the back side of the first RDL to a front side of the second RDL;
    a second molding compound encapsulating the second die and the plurality of conductive pillars between the back side of the first RDL and the front side of the second RDL.

2. The package of claim 1, further comprising a plurality of conductive bumps on a back side of the second RDL.

3. The package of claim 1, wherein the first molding compound does not completely cover a top surface of the first die.

4. The package of claim 3, wherein the second molding compound does not completely cover a bottom surface of the second die adjacent the second RDL.

5. The package of claim 1, wherein the second RDL comprises a second redistribution line formed directly on one of the plurality of conductive pillars.

6. The package of claim 5, wherein the die attach film is a cured film.

7. The package of claim 5, wherein the second RDL comprises a third redistribution line formed directly on a conductive contact of the second die.

8. The package of claim 5, wherein a bottom surface of a conductive contact of the second die, and bottom surfaces of the plurality of conductive pillars are coplanar.

9. A package comprising:
    a first element including a bottom surface that includes a first contact pad and a passivation layer;
    a first redistribution layer (RDL);
    wherein the first element is attached to a front side of the first RDL such that the front side of the first RDL is directly on the first contact pad and the passivation layer;
    a first molding compound encapsulating the first element on the front side of the first RDL;
    a top surface of a second die attached to a back side of the first RDL with a die attach film such that the second die is facing back to the first RDL;
    a second RDL;
    a plurality of conductive pillars extending from the back side of the first RDL to a front side of the second RDL;
    a second molding compound encapsulating the second die and the plurality of conductive pillars between the back side of the first RDL and the front side of the second RDL.

10. The package of claim 9, wherein the second die is a logic die.

11. The package of claim 10, wherein the first element is a memory die.

12. The package of claim 9, wherein the first RDL is less than 50 μm thick.

13. The package of claim 9, wherein the second RDL is less than 50 μm thick.

14. The package of claim 9, wherein the second RDL comprises a second redistribution line formed directly on one of the plurality of conductive pillars.

15. The package of claim 9, wherein the second RDL comprises redistribution lines formed directly on one of the plurality of conductive pillars, and directly on a conductive contact of the second die.

16. The package of claim 15, wherein the die attach film is a cured film.

* * * * *